United States Patent
Wang

(10) Patent No.: US 8,441,387 B2
(45) Date of Patent: May 14, 2013

(54) CONTINUOUS RAMP GENERATOR DESIGN AND ITS CALIBRATION FOR CMOS IMAGE SENSORS USING SINGLE-RAMP ADCS

(75) Inventor: Yibing Michelle Wang, Temple City, CA (US)

(73) Assignee: SK Hynix Inc., Gyeonggi-do (KR)

( * ) Notice: Subject to any disclaimer, the term of this patent is extended or adjusted under 35 U.S.C. 154(b) by 179 days.

(21) Appl. No.: 13/017,724

(22) Filed: Jan. 31, 2011

(65) Prior Publication Data

US 2012/0194367 A1    Aug. 2, 2012

(51) Int. Cl.
    *H03M 1/56*    (2006.01)
(52) U.S. Cl.
    USPC .......................... 341/169; 341/155

(58) Field of Classification Search .............. 341/169, 341/155, 117, 118, 120, 122, 167, 170
See application file for complete search history.

(56) References Cited

U.S. PATENT DOCUMENTS

| | | | |
|---|---|---|---|
| 6,975,259 B1 * | 12/2005 | Jensen | 341/143 |
| 2007/0046802 A1 | 3/2007 | Ham | |

* cited by examiner

*Primary Examiner* — Joseph Lauture
(74) *Attorney, Agent, or Firm* — William Park & Associates Patent Ltd.

(57) ABSTRACT

Aspects of the invention provide a continuous ramp generator design and its calibration for CMOS image sensors using single-ramp ADCs. An embodiment of the invention comprises controlling a coarse gain, integer gain, and fine gain of the analog-to-digital converter. Gain of the analog-to-digital converter may be calibrated by tuning the integer gain based on reference voltages converted to equivalent digital values.

26 Claims, 8 Drawing Sheets

CONTINUOUS RAMP GENERATOR DESIGN AND ITS CALIBRATION FOR CMOS IMAGE SENSORS USING SINGLE-RAMP ADCS

FIELD OF THE INVENTION

Certain embodiments of the invention relate to ADCs, and more particularly to a continuous ramp generator design and its calibration.

BACKGROUND OF THE INVENTION

As computers and processors become more powerful, more and more signal processing is being done in the digital domain. Digital signal processing can perform complex operations to manipulate input data to approximate real world analog signals, and the operations can be performed in real time, or the digital data can be stored for future processing. Since real world signals exist as analog signals, these analog signals need to be converted to equivalent digital signals.

Analog to digital converters (ADCs) are used in many applications, such as, for example, converting analog control signals in industrial applications, audio signals in music, photographic images in digital cameras, and video images in digital video cameras. As with most circuits, there are many different types of ADCs where tradeoffs are made for different limitations. Some, such as the "flash" ADC, are relatively expensive in circuitry and layout space and, accordingly, limited in resolution since every additional bit requires doubling of the number of comparators, but very fast in conversion speed. Others, such as the ramp ADC, can be fairly simple but slow in conversion time. And as the amount of resolution increases, the conversion time will increase.

Accordingly, a particular application needs to take into account various limitations and determine which design best serves its purposes. However, picking a specific design, and possibly modifying it to improve its design, can still present certain challenges that need to be overcome.

For high resolution and high speed imaging, column parallel ADC architecture has become widely used in CMOS image sensors. The architecture may comprise single-slope ADCs that need a ramp signal to compare with the input signal. In general, the ramp signals are generated as staircases, which have undesirable limitations for a high speed operation.

This problem can be overcome by using a non-staircase, linear ramp signal. However, the slope of the ramp signal, which sets the gain and input range of the ADC, is independent of operating frequency of the ADC. Furthermore, the slope of the ramp signal is affected by the changes due to temperature variations, supply signal variations and other process variations. The gain error in the ADC can cause errors in the ADC input range, which can then cause the output image to be under-exposed or saturated. The gain errors between the different color channels can cause color distortions in the final image.

Further limitations and disadvantages of conventional and traditional approaches will become apparent to one of skill in the art, through comparison of such systems with some aspects of the present invention as set forth in the remainder of the present application with reference to the drawings.

BRIEF SUMMARY OF THE INVENTION

Certain embodiments of the invention provide a continuous ramp generator design and its calibration for CMOS image sensors using single-ramp ADCs. Various embodiments may comprise controlling a coarse gain of an analog-to-digital converter, controlling integer gain of the analog-to-digital converter, and controlling a fine gain of the analog-to-digital converter.

The coarse gain may be achieved via use of a first current generator, which may be a current digital-to-analog converter (IDAC), where a first control signal may control the coarse gain. The integer gain may be achieved via use of a second current generator, which may also be an IDAC, where a second control signal may control the integer gain. The fine gain may be achieved via an integrator, where a third control signal may control fine gain. The third control signal may control capacitance of a feedback capacitor for the integrator.

An output signal of the first current generator may be communicated to an input of the second current generator, and an output signal of the second current generator may be communicated to an input of the integrator. The integrator may output a ramp signal that may be used by the analog-to-digital converter for converting analog signals to digital signals.

A gain of the ramp signal, and accordingly the gain of the analog-to-digital converter, may be calibrated, where the gain may comprise the coarse gain, the integer gain, and the fine gain. Accordingly, the gain of the analog-to-digital converter may be controlled by controlling the gain of the ramp signal. The calibration of the analog-to-digital converter may comprise using default values for the first control signal, the second control signal, and the third control signal for a default gain.

The calibration may comprise converting, with the analog-to-digital converter, a first analog reference signal to a first digital value and a second analog reference signal to a second digital value. The first digital value may be subtracted from the second digital value to get a difference value. The second control signal may then be tuned based on comparing the difference value to an expected value.

For example, the value of the second control signal may be increased if the difference value is larger than the expected value, and decreased if the difference value is smaller than the expected value. The adjusting of the second control signal may continue until the calibration is finished. The calibration of the analog-to-digital converter may be deemed to be finished if the difference value is equal to the expected value. The calibration of the analog-to-digital converter may also be deemed to be finished if the difference value is larger than the expected value in a present iteration and the difference value was smaller than the expected value in an immediately previous iteration. Similarly, the calibration of the analog-to-digital converter may be deemed to be finished if the difference value is smaller than the expected value in a present iteration and the difference value was larger than the expected value in an immediately previous iteration.

An embodiment of the invention may also comprise an analog-to-digital converter (ADC) array comprising columns ADCs and at least one calibration ADC, a ramp generator module configured to provide a ramp signal to the column ADCs and the calibration ADCs, a reference module configured to provide reference signals to the calibration ADCs and to the ramp generator module, and control circuitry configured to provide control signals to the ramp generator module. The column ADCs may be used to convert analog pixel signals to digital data. The calibration ADCs may be used in calibrating the column ADCs.

The ramp generator module may comprise a first current generator, a second current generator, and an integrator. The ramp signal may be calibrated using a first control signal to control the first current generator, a second control signal to control the second current generator, and a third control signal to control the integrator, and wherein the first control signal, the second control signal, and the third control signal are generated by the control circuitry.

When calibration of the ramp signal starts, default values may be used for the first control signal, the second control signal, and the third control signal to generate an initial ramp signal for use by the column ADCs.

During calibration, the calibration ADC converts a first analog reference signal to a first digital value and a second analog reference signal to a second digital value. A subtraction module in the control circuitry subtracts the first digital value from the second digital value to get a difference value. The control circuitry tunes the second control signal based on comparing the difference value to an expected value.

When the difference value is larger than the expected value, the control circuitry increases value of the second control signal. When the difference value is smaller than the expected value, the control circuitry decreases the value of the second control signal.

The control circuitry may end the calibration of the ramp signal if the difference value is equal to the expected value. The control circuitry may also end calibration of the ramp signal if the difference value is larger than the expected value in a present iteration and the difference value was smaller than the expected value in an immediately previous iteration. Similarly, the control circuitry may end the calibration of the ramp signal if the difference value is smaller than the expected value in a present iteration and the difference value was larger than the expected value in an immediately previous iteration.

These and other advantages, aspects and novel features of the present invention, as well as details of an illustrated embodiment thereof, will be more fully understood from the following description and drawings.

BRIEF DESCRIPTION OF THE DRAWINGS

A further understanding of the nature and advantages of examples provided by the disclosure may be realized by reference to the remaining portions of the specification and the drawings wherein like reference numerals are used throughout the several drawings to refer to similar components. In some instances, a sub-label is associated with a reference numeral to denote one of multiple similar components. When reference is made to a similar numeral without specification to an existing sub-label, the reference numeral refers to all such similar components.

DETAILED DESCRIPTION OF THE INVENTION

The following description provides exemplary embodiments only and is not intended to limit the scope, applicability, or configuration of the invention. Rather, the ensuing description of the embodiments will provide those skilled in the art with an enabling description for implementing embodiments of the invention. Various changes may be made in the function and arrangement of elements without departing from the spirit and scope of the invention as set forth in the appended claims.

Thus, various embodiments may omit, substitute, or add various procedures or components as appropriate. For instance, it should be appreciated that in alternative embodiments the methods may be performed in an order different than that described, and that various steps may be added, omitted, or combined. Also, features described with respect to certain embodiments may be combined in various other embodiments. Different aspects and elements of the embodiments may be combined in a similar manner.

It should also be appreciated that the following systems and methods may be components of a larger system, wherein other procedures may take precedence over or otherwise modify their application. Also, a number of steps may be required before, after, or concurrently with the following embodiments.

Embodiments of the present invention will be described in detail with reference to the accompanying drawings such that the scope of the present invention can be easily embodied by those skilled in the art.

Certain embodiments of the invention may be found in a continuous ramp generator design and its calibration for CMOS image sensors using single-ramp ADCs.

Figure 1:
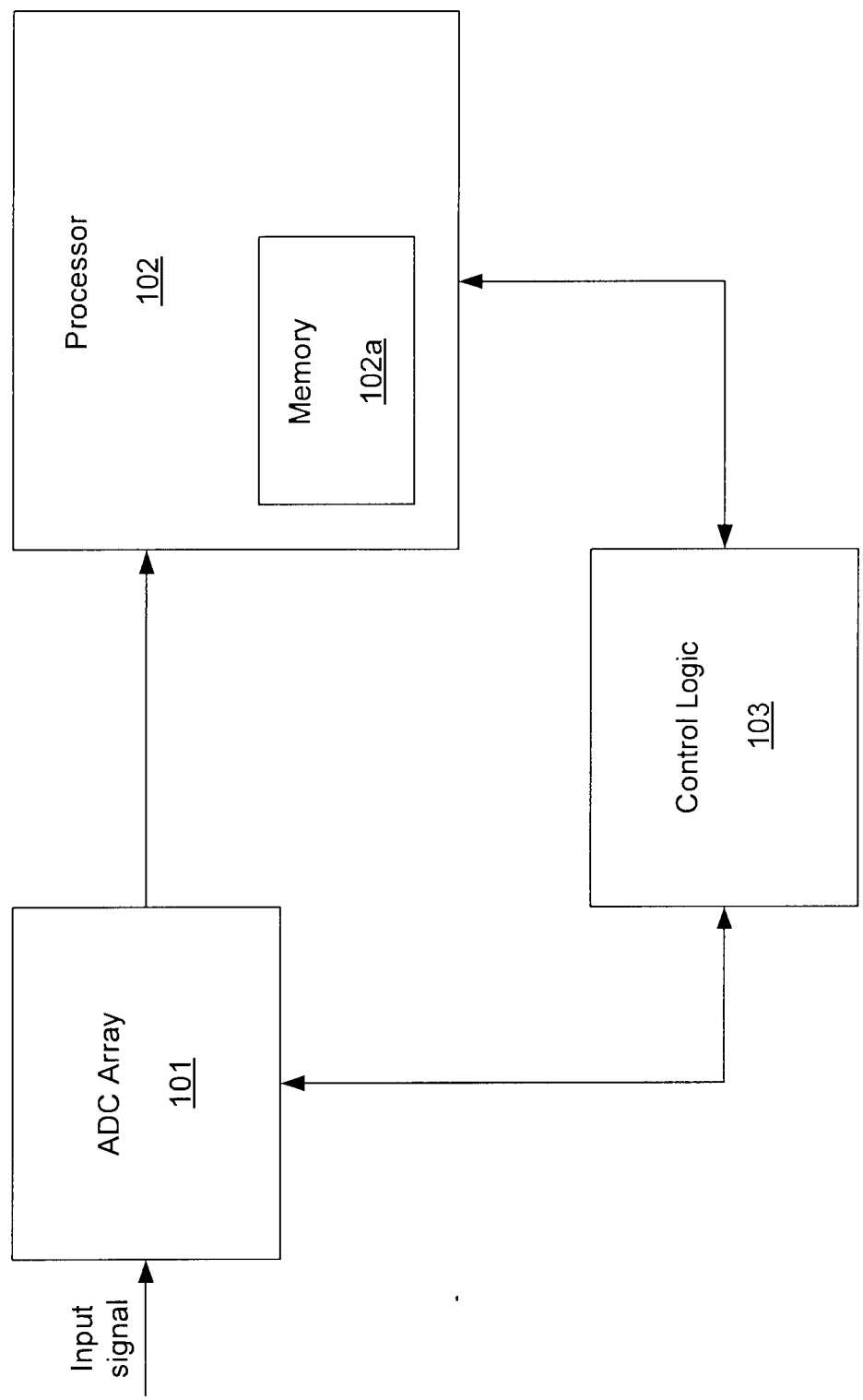
FIG. 1 is a block diagram of exemplary system for analog to digital conversion that may be used with an embodiment of the invention.

FIG. 1 is a block diagram of exemplary system for analog to digital conversion that may be used with an embodiment of the invention. Referring to FIG. 1, there is shown a portion of a circuitry for processing input data, comprising the ADC 101, the processor 102, and the control logic 103.

The ADC 101 converts input analog signals, such as, for example, pixel signals from a video image sensor (not shown in FIG. 1A) to equivalent digital signals. The digital signals output by the ADC 101 may be further processed by the processor 102. The processor 102 may, for example, use digital signal processing methods to compress the digital signals from the ADC 101 to a standard video format such as MPEG-1, MPEG-2, or MPEG-4. The processor 102 may also comprise a memory block 102a where code may be stored. This code may be executed by the processor 102 to perform various functions such as, for example, digital signal processing. The memory block 102a may also be used to store digital signals from the ADC 101 and/or digital signals that result from processing the digital signal from the ADC 101.

The control logic 103 may comprise circuitry that generates clocks, control and enable signals, and commands for a variety of modules, such as the ADC 101. For example, the control logic 103 may generate a clock signal that is used for counting in the ADC 101, where the clock signal is not continuously running. A running clock comprises pulses while a non-running clock is in either a low state or a high state. The control logic 103 may also output enable signals that enable the counters in the ADC 101 to count during specific portions of time, and also reset signals.

Figure 2:
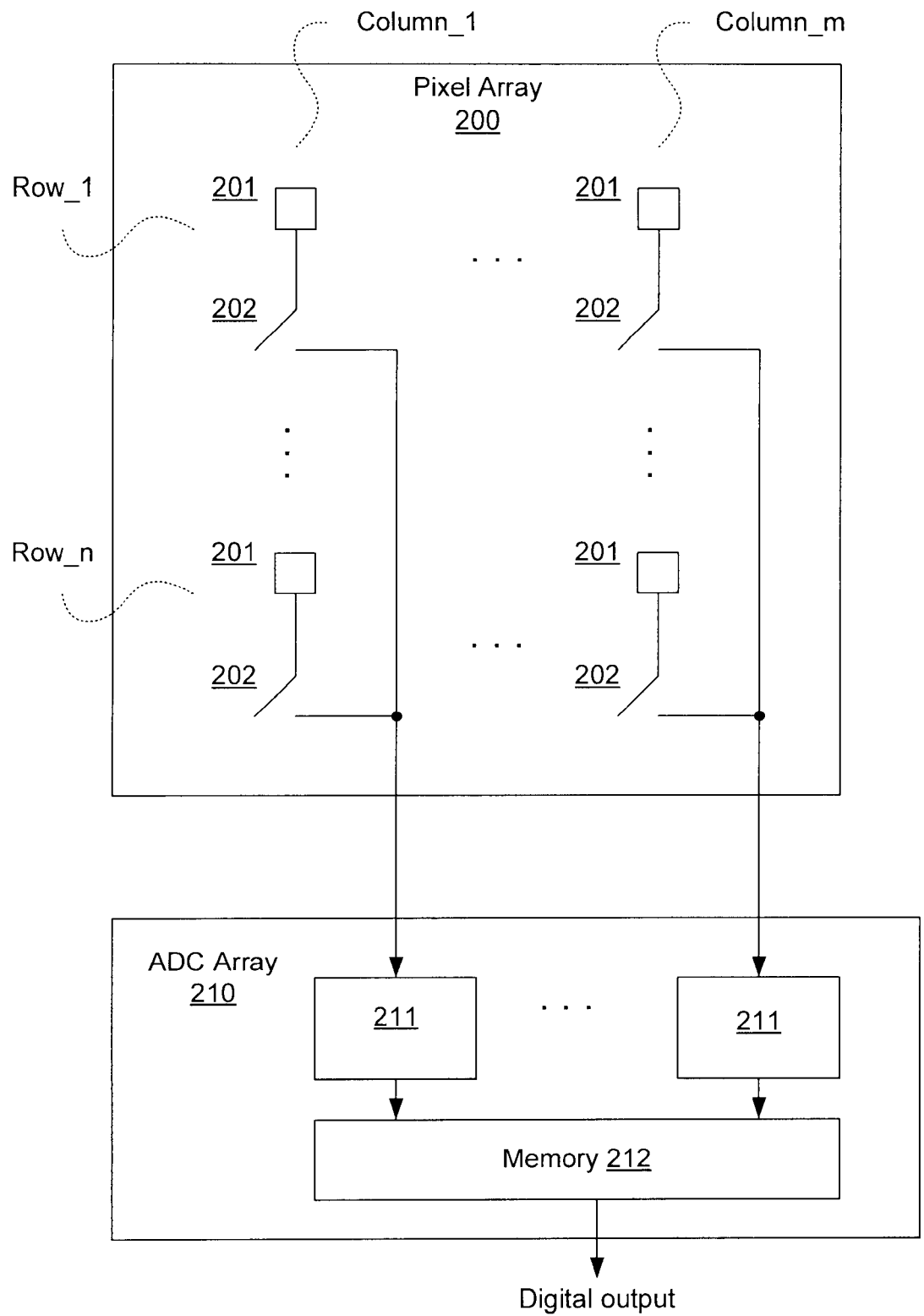
FIG. 2 is a block diagram of an exemplary system for column parallel analog digital converters that may be used with an embodiment of the invention.

FIG. 2 is a block diagram of an exemplary column parallel analog digital converter configuration that may be used with an embodiment of the invention. Referring to FIG. 2, there are shown a pixel array 200 and an ADC array 210. The pixel array 200 may comprise pixel elements 201 and switching elements 202. The pixel elements 201 may comprise suitable circuitry that outputs, for example, voltage proportional to an amount of light detected by the pixel element 201. The pixel element 201 may be sensitive to specific wavelengths of the incident light. The ADC array 210 may comprise, for example, an array of ADC elements 211, where each ADC element 211 may correspond to a column of the pixel elements 201. The outputs of the ADC elements 211 may be stored in a memory block 212.

In operation, appropriate control signals from, for example, the control logic 103 may enable the switching elements 202 to open and close appropriately so that output voltage from a particular pixel element 201 is communicated to the ADC array 210. Accordingly, for each column Column_1 to Column_m, only one particular switch element 202 in all of the rows Row_1 to Row_n may be closed during a row scan time so that output voltage from the corresponding pixel element 201 is communicated to the ADC array 210 during that scan time. Therefore a true pixel voltage may be communicated to a corresponding ADC element 211 when only one pixel is selected for the column.

The output voltage from one of the pixel elements 201 in each of the columns Column_1 to Column_m may be converted to equivalent digital values by the corresponding ADC elements 211. However, since there is a plurality of ADC elements 211, each ADC element 211 may need to be calibrated so that each ADC element 211 outputs a similar digital value for a given input. Calibration may be done periodically, for example, such as once during a row scan time or once during a frame. The particular period for calibration may be design and/or implementation dependent.

While FIG. 2 may have been drawn and described as the pixel array 200 having switching elements 202 for the sake of clarity, the invention need not be so limited. For example, the switching elements 202 may be part of the ADC array 210.

Figure 3:
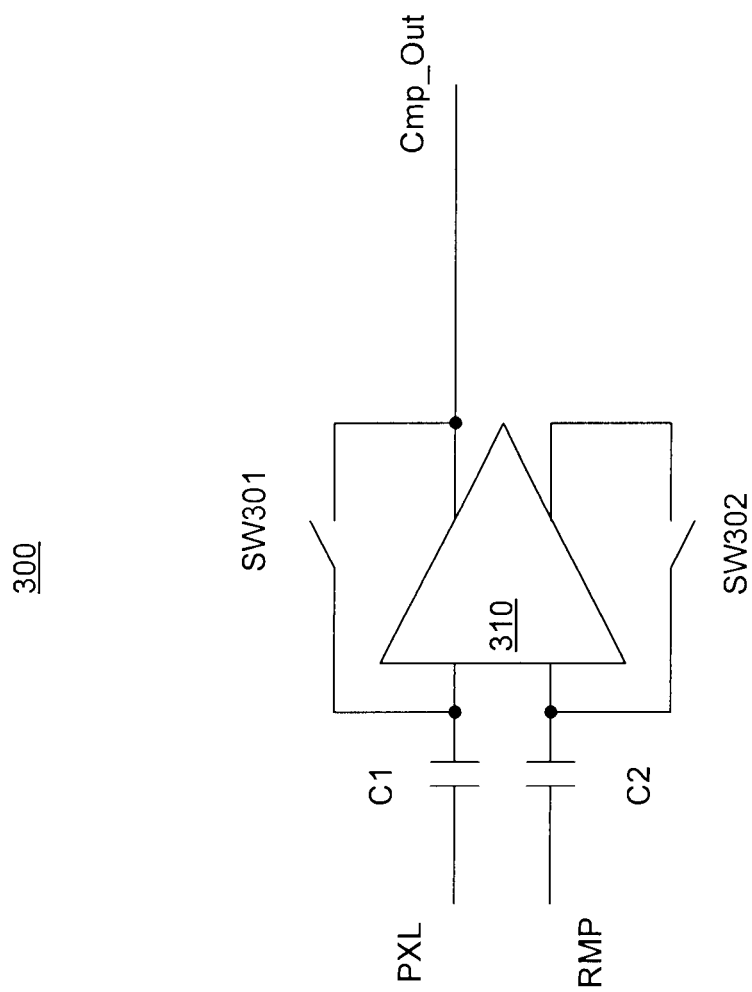
FIG. 3 is a block diagram of an exemplary comparator architecture that may be used with an embodiment of the invention.

FIG. 3 is a block diagram of an exemplary comparator architecture that may be used with an embodiment of the invention. Referring to FIG. 3, there is shown a comparator element 300, which may be similar to the comparator element 211, comprising comparator 310, coupling capacitors C1 and C2, and switching elements SW301 and SW302.

In operation, the switching elements SW301 and SW302 may be closed by a command from, for example, the control logic 103 to reset inputs of the comparator 310 to a known state. This may be referred to as auto-zeroing the input voltage. The switching elements SW301 and SW302 may then be opened and the input signals PXL and RMP may be applied. The input signal PXL may be, for example, a voltage from a pixel, and the input signal RMP may be a downward sloping voltage signal.

Generally, the input signal RMP may be at a higher initial voltage level than the input signal PXL. Accordingly, output signal Cmp_out of the comparator 310 may be deasserted. However, as the input signal RMP is decreasing in voltage, there may be a point when the level of the input signal RMP crosses the level of the input signal PXL. As the input signal RMP decreases further and the input signal RMP is less than the as the input signal PXL, the comparator may assert the output signal Cmp_out. The output signal Cmp_out may be communicated to, for example, a counter (not shown) that may be used to count the number of clocks from when the input signal RMP starts to ramp down until the output signal Cmp_out is asserted. The count value may be used to give a final equivalent digital value of the analog input signal.

While a single stage comparator was shown for the comparator element 300 with respect to FIG. 3, the invention need not be so limited. For example, a two-stage comparator may be used where the comparator 310 may feed another comparator 310. Similarly, other multi-stage comparator may be used.

Figure 4:
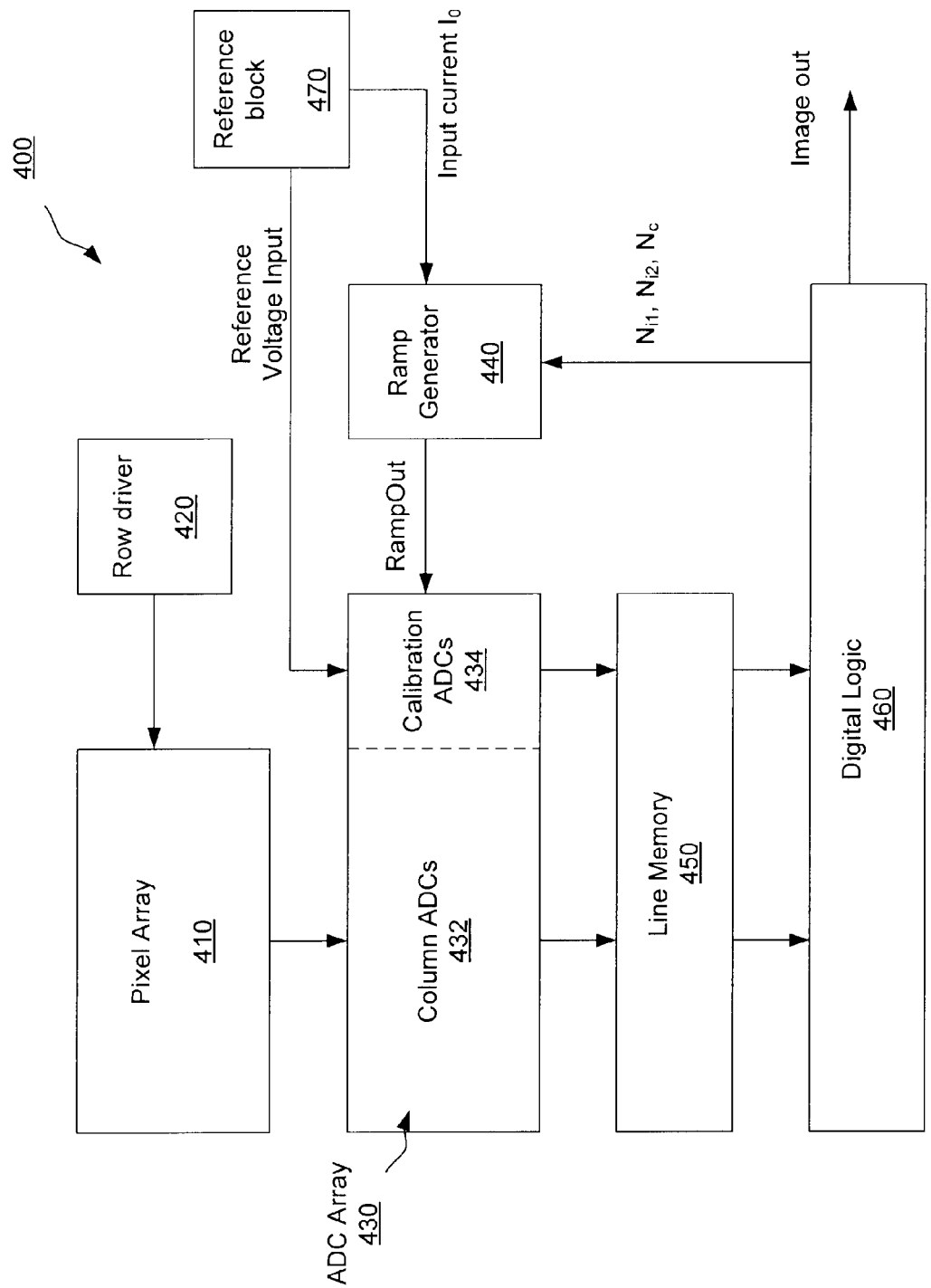
FIG. 4 is a block diagram of an exemplary system for analog to digital conversion in accordance with an embodiment of the invention.

FIG. 4 is a block diagram of an exemplary system for analog to digital conversion in accordance with an embodiment of the invention. Referring to FIG. 4, there is shown an analog to digital conversion system 400 comprising a pixel array 410, a row driver 420, an ADC module 430, a ramp generator 440, line memory 450, digital logic block 460, and a reference block 470. The ADC module 430 comprises column ADCs 432 and one or more calibration ADCs 434.

The pixel array 410 may be similar to, for example, the pixel array 200 shown in FIG. 2. The row driver 420 may comprise suitable circuitry that can generate word lines that may be used to select a particular row, for example, Row_1 in FIG. 2, to output signals. The ADC module 430 may comprise suitable circuitry that can sample signals and convert the sampled signals to digital equivalent data. The column ADCs 432 may be used to convert signals from the pixel array 410 to digital data. The calibration ADCs 434 may be used to calibrate the column ADCs 432. The ramp generator 440 may comprise suitable circuitry to generate a reference ramp signal that may be used to compare to the sampled pixel signals. The line memory 450 may comprise suitable circuitry for storing digital data from the ADC module 430. The digital logic block 460 may comprise suitable circuitry for processing the digital data from the line memory 450.

In operation, rows of pixels in the pixel array 410 are addressed through the horizontal word lines output by the row driver 420. The charges or the voltage signals output by a row of the pixel array 410, for example, Row_1 in FIG. 2, are communicated to the ADC module 430 via column bit lines. Pixels in the pixel array 410 are arranged in a two-dimensional structure similar to FIG. 2, where the row driver 420 controls a particular row to output its pixel signal onto the column bit lines. Accordingly, every pixel in a row will output its signal in parallel.

The ADC module 430 comprises column ADCs 432 and calibration ADCs 434. A plurality of column ADCs 432 (not shown) in the ADC module 430 samples pixel signals on the column bit lines, and the sampled pixel signals are then converted to an equivalent digital signal by the ADCs. The ADC module 430 may use, for example, correlated double sampling (CDS), which is a technique for measuring electrical values such as voltages or currents that allows for removal of an undesired offset. It is used quite frequently when measuring sensor outputs. The output of the pixel is measured twice, first the reset level of the pixel and second the signal level of the pixel. The difference of the two represents the incident light intensity. Both of these levels include offset caused by thermal noise and device mismatch. By taking a difference of the two, this offset is cancelled out. The value measured from the known condition is then subtracted from the unknown condition to remove an offset that may be present in the ADC module 430. CDS is commonly used in switched capacitor operational amplifiers (op amps) to effectively double the gain of the charge sharing op amp.

The two dimension array of pixels in the pixel array 410 is organized into rows and columns. The pixels in a given row share the reset lines, so that all the pixels in a row are reset at the same time. The pixels in a row are also tied to a word line. Although a plurality of pixels, for example, Column_1 in FIG. 2, in the pixel array 410 share the same column bit line, since only one row is selected at any given time, the pixel signal on a column bit line is not deteriorated by mixing with signals from other pixels in the column.

The ramp generator 440 provides a ramp signal RampOut to all column ADCs 432 in the ADC module 430, each of which receives a reset signal and a pixel signal from the active pixel array 410. Each column ADCs 432 in the ADC module 430 first samples the reset signal and then receives pixel signals from the pixel array 410. The ADC then obtains the difference between the reset signal and the pixel signal. The difference signal is compared with the ramp signal RampOut output by the ramp generator 440. When the ramp signal first starts to ramp, a counter (not shown) may be enabled in each column ADC 432 in the ADC module 430. When the level of the difference signal is about the same as the level of the ramp signal level RampOut, the corresponding counter will be stopped and the count will be stored in a corresponding portion of the line memory 450. This count is the digital signal equivalent to the input pixel signal.

The digital logic block 460 may read the digital signals stored in the line memory 450 and may process the digital signals. For example, in an embodiment of the invention, the digital logic block 460 may perform digital signal processing to convert the digital signals to one of various video formats such as MPEG-4 or H.263. In various embodiments of the invention, the digital logic block 460 may also generate various signals such as, for example, $N_{i1}$ $N_{i2}$, and $N_c$. Accordingly, the digital logic block 460 may output digital signals ImageOut.

The calibration ADCs 434 in the ADC module 430 may be used to calibrate the column ADCs 432. The calibration ADCs 434 may receive a reset signal and a reference signal from, for example, the reference block 470. A difference of the reset signal and the reference signal may be communicated to an input of the calibration ADCs 434. A ramp signal may also be communicated to an input of the calibration ADCs 434 and a digital signal equivalent of the reference signal may be generated. This digital signal equivalent may be used to calibrate the column ADCs 432.

Figure 5:
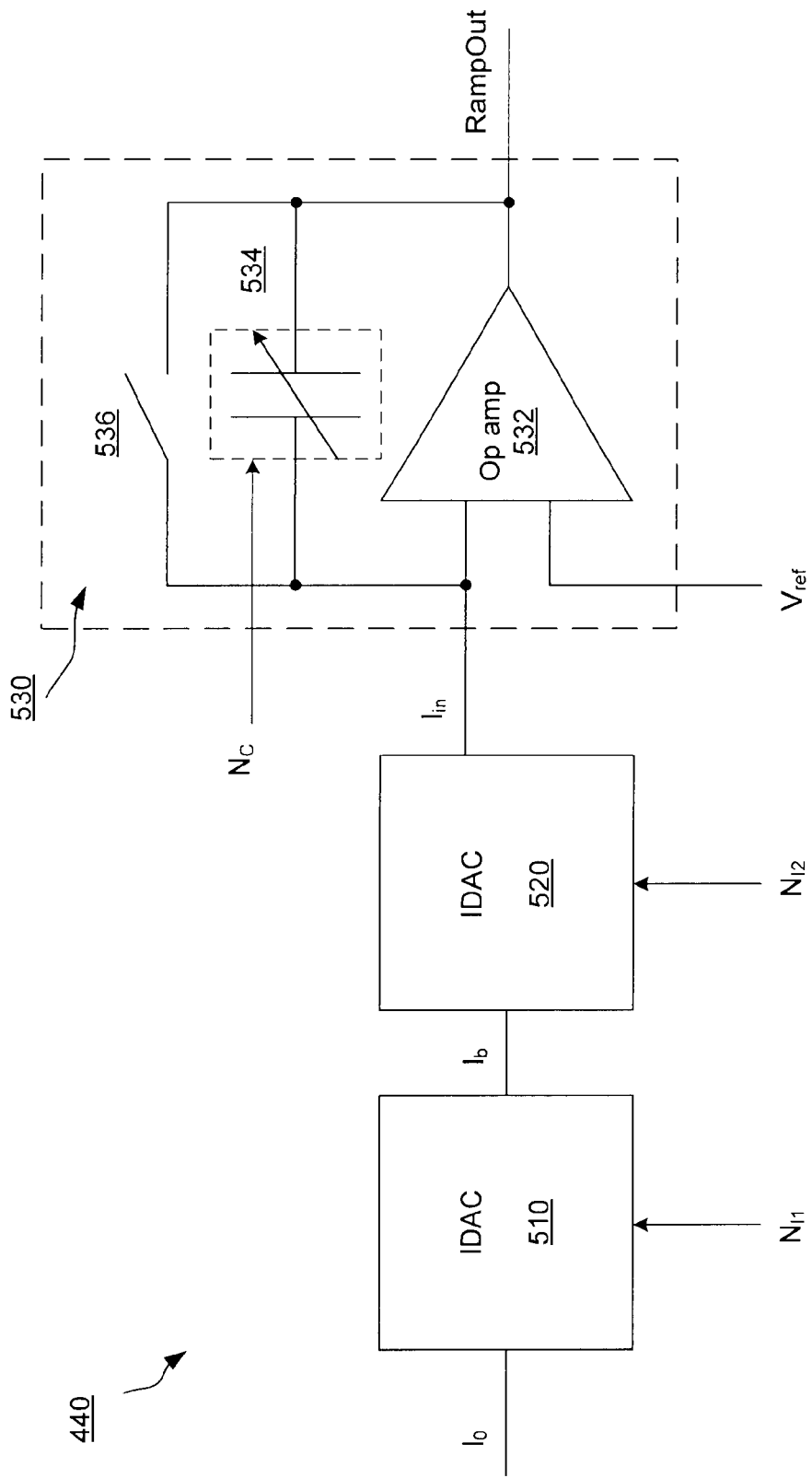
FIG. 5 is a block diagram of an exemplary continuous ramp generator in a single slope ADC in accordance with an embodiment of the invention.

FIG. 5 is a block diagram of an exemplary continuous ramp generator in a single slope ADC in accordance with an embodiment of the invention. Referring to FIG. 5, there is shown a continuous ramp generator 440 from FIG. 4, comprising current DACs (IDACs) 510 and 520, and an integrator 530. The integrator 530 comprises an op amp 532, a variable capacitor 534, and a switch 536.

In operation, the IDAC 510 receives an input signal $I_0$, which may be a reference signal generated in a system for analog to digital conversion, and outputs a bias signal $I_b$. The magnitude of the output signal $I_b$ is controlled by a control signal $N_{i1}$. The IDAC 520 receives the signal $I_b$ and outputs a current signal $I_{in}$. The magnitude of the output signal $I_{in}$ is controlled by control signal $N_{i2}$. The integrator 530 receives the current signal $I_{in}$ and a reference signal $V_{ref}$ to generate the ramp signal RampOut. The slope of the ramp signal RampOut may be controlled by the control signal $N_c$. The control signals $N_{i1}$, $N_{i2}$, and $N_c$ may be, for example, digital signals comprising a plurality of bits. The ramp signal RampOut may be reset by closing the switch 536.

The slope of the ramp signal RampOut, or a gain of an ADC in the ADC module 430, can be adjusted by varying the current signal $I_{in}$ to the integrator 530 through the two IDACs 510 and 520 and by varying the capacitance of the variable capacitor 534. The IDAC 510 may be used for coarse gain adjustment. The IDAC 520 may be used to set the integer gain steps. The variable capacitor 534 may be used to set the fine gain steps, for example 0.5x, 0.25x or 0.125x where x is the amount of voltage indicated by the least significant bit of the equivalent digital data to an input analog signal.

The gain of a single-slope ADC may depend on the ramp signal RampOut voltage swing range during an analog-to-digital conversion time. The ramp signal RampOut voltage swing is the maximum peak voltage that the integrator 530 can produce before it starts clipping. This maximum peak voltage is typically dependent on the voltage supplied to the op amp 532. That is, the higher the supply voltage, the higher the output voltage swing.

Gain of the ADC may be expressed as Gain=$V_{1x}/V_{gain}$. Given the default signal swing $V_{1x}$ at ADC gain of 1, the gain can be rewritten as $1=V_{1x}/V_{gain}$ or $V_{1x}=V_{gain}$. Here, $V_{gain}$ can be expressed as $V_{gain}=(I_{in}/C_{fb})*(2^n*1/f_{ads})$, where $I_{in}$ is the input current of the integrator 430, $C_{fb}$ is the capacitance of the variable capacitor 534, n is the ADC resolution, and $f_{adc}$ is the ADC's operating frequency. If the input current of the integrator is $I_{in}=I_b*N_{i2}=I_0*N_{i1}*N_{i2}$, and the variable capacitor 534 of the integrator is $C_{fb}=C_0*(N_c+1)$, where $C_0$ is some unit capacitance and $N_c$ is an integer greater or equal to zero, then the default signal swing can be rewritten as:

$$V_{1x}=[(I_0*N_{i1\_1x}*N_{i2\_1x})/(C_0*(N_{c\_1x}+1))]*(2^n)*(1/f_{adc})$$ (Equation 1).

An ADC may now be adjusted based on Equation 1 to correctly set its gain. This may comprise adjusting the control signal $N_{i1}$ for the IDAC 510, the control signal $N_{i2}$ for the IDAC 520, and the control signal $N_c$ for the integrator 530. A coarse gain may be adjusted by varying the output current of the IDAC 510. For a nominal gain of 1 (or 1x gain) for an n-bit ADC conversion, the default values for an operating frequency of the ADC and the control signal for the IDAC 510 may be respectively referred to as $f_{adc\_def}$ and $N_{i1\_def}$. However, when ADC operating frequency and/or resolution changes, to keep the ramp signal RampOut voltage swing range constant, the IDAC 510 output $I_b$ may be adjusted using, for example, the following equation: $N_{i1\_gain}=(N_{i1\_def}/f_{adc\_def})*2^{n-m}*f_{adc}$ where 'm' is the new resolution and $f_{adc}$ is the new operating frequency. Since the ratio $(N_{i1\_def}/f_{adc\_def})$ is a predefined default value, the control signal $N_{i1}$ for the IDAC 510 may be calculated.

The gain of the ADC may be further adjusted by varying the output signal $I_{in}$ of the IDAC 520. Accordingly, the output of the IDAC 520 may be adjusted by the control signal $N_{i2}$ where, for example, the following equation can be used for a specific gain:

$$N_{i2\_1x}=gain*N_{i2\_gain}$$ (Equation 2).

Additionally, while any gain may be allowed, in order to simplify control of the IDAC 520, various embodiments of the invention may limit gains to a power of 2, such as, for example, gain of 1, 2, 4, 8, etc.

The variable capacitor 534 may be adjusted for fine gain adjustment between these integer gains. For gain of 1, 2, 4, and 8, the capacitor setting is always $N_{c+1}x$, which is usually the maximum setting. For a gain setting less than $2^z$ but greater than $2^{z-1}$, $N_{i2}$ is set to $N_{i2\_2z}$, where $N_{i2\_2z}$ is a default value for the exponent z, and $N_{c\_gain}$ may be calculated using, for example, the equation $N_{c\_gain}=(gain/2^z)*(N_{c\_1x}+1)-1$.

Accordingly, by adjusting the control signals $N_{i1}$, $N_{i2}$, and $N_c$, the relative gain of the continuous ramp generator 440 may be controlled. However, the absolute swing of the ramp signal RampOut may be hard to control because the input signal $I_0$ to the continuous ramp generator 440 may be sensitive to temperature, process, and supply variations. Calibration taking into account the input signal $I_0$ may be performed using several column ADCs with known inputs.

In the ADC module 430 there may be one or more calibration ADCs 434 that convert the difference between two known reference voltages into digital code. This digital code is then compared with the nominal expected code in the digital logic block 460 to calibrate the slope of the ramp output signal RampOut. This is explained in more detail with respect to FIG. 7.

Figure 6:
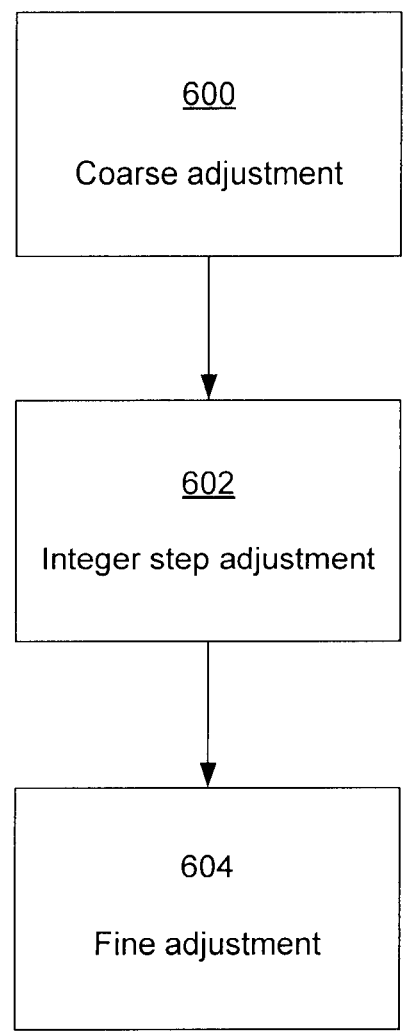
FIG. 6 is a flow diagram of an exemplary method for setting a gain of an ADC in accordance with an embodiment of the invention.

FIG. 6 is a flow diagram of an exemplary method for setting a gain of an ADC in accordance with an embodiment of the invention. Referring to FIG. 6, there are shown blocks 600, 602, and 604 in the flow diagram. Block 600 shows that a coarse adjustment may be made for a given operating frequency and/or resolution by selecting an appropriate value for the control signal $N_{i1}$ for IDAC 510.

Block 602 shows that an integer step gain adjustment may be made by selecting an appropriate value for the control signal $N_{i2}$ for IDAC 520. Block 604 shows that a fine gain adjustment may be made by selecting an appropriate value for the control signal $N_c$ for the integrator 530. The values for the control signals $N_{i1}$ $N_{i2}$, and $N_c$ may be selected as described above with respect to FIG. 5.

Figure 7:
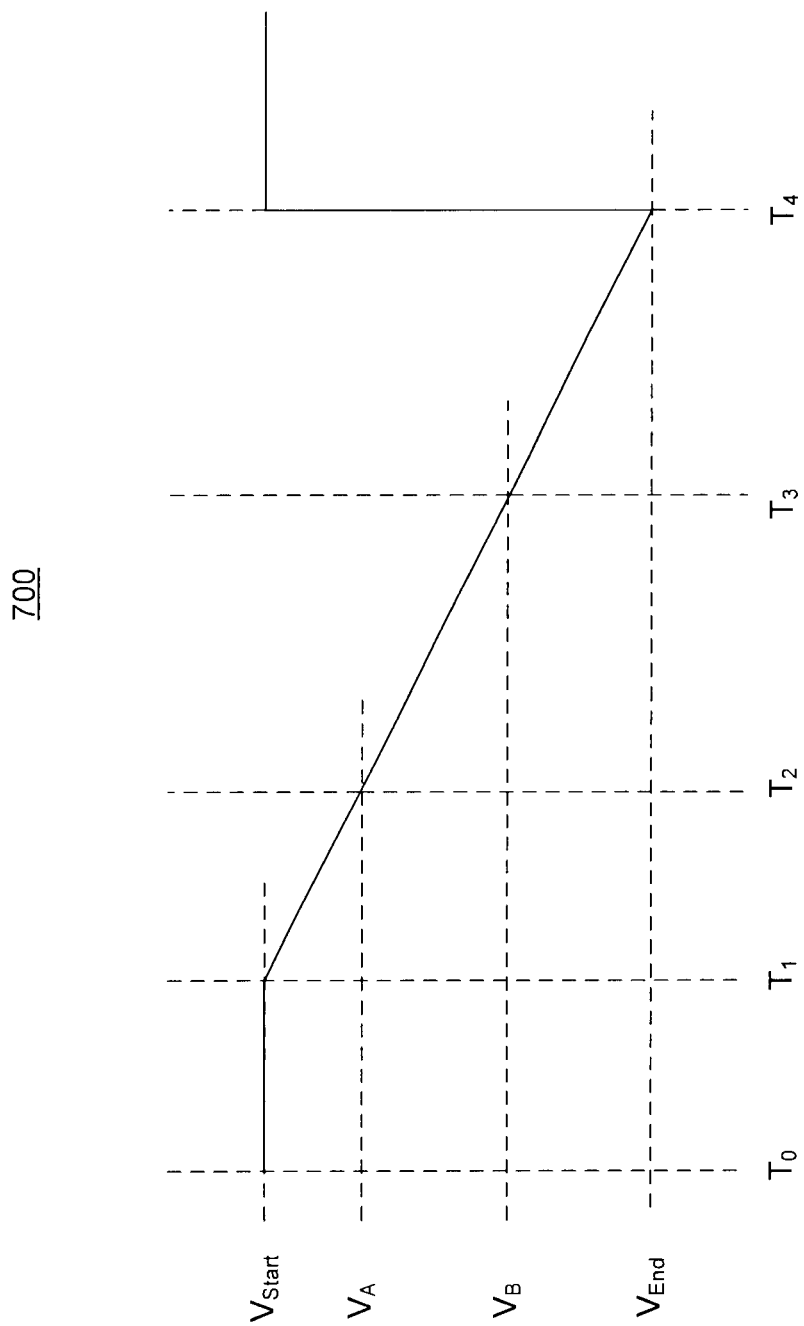
FIG. 7 is a figure illustrating an exemplary ramp calibration scheme in accordance with an embodiment of the invention.

FIG. 7 is a graph illustrating an exemplary ramp calibration scheme in accordance with an embodiment of the invention. Referring to FIG. 7, there is shown a graph 700 where the vertical axis denotes voltage and the horizontal axis denotes time. Along the horizontal axis, there are shown time instances $T_0$, $T_1$, $T_2$, $T_3$, and $T_4$. Along the vertical axis, there are shown voltage levels $V_{Start}$, $V_A$, $V_B$, and $V_{End}$.

The calibration procedure may start by setting $N_{i1}$ based on the operating frequency. Default values may be used for the control signals $N_{i2}$ and $N_c$ for a desired gain.

At time $T_0$ the ramp signal RampOut may be at a voltage level of $V_{Start}$. During read out for a first row in the pixel array 410, a reference block 470 may send reference voltages Vr and V0 to the calibration ADCs 434, where Vr may be a reset voltage similar to the reset signal sent to the column ADCs 432. A calibration ADC 434 may comprise circuitry (not shown) that may subtract the reference signals Vr and V0 and provide signal (Vr−V0) to an input of a comparator, which may be similar to, for example, the comparator element 300. The ramp signal RampOut may be an input to the comparator element 300. Accordingly, the comparator element 300 may compare the input signals (Vr−V0) with RampOut.

The voltage of the ramp signal RampOut may remain at $V_{Start}$ until time $T_1$ when the voltage level starts to ramp down. At time $T_2$ the voltage level of the ramp signal RampOut may be at $V_A$, which may be the voltage level of the input signal (Vr−V0). Accordingly, the comparator element 300 may assert an output signal Cmp_out that may be used to latch a count of clock cycles that may have elapsed from time $T_1$ to time $T_2$. This clock count may be referred to as digital code_0. The ramp signal RampOut may continue to ramp down until time $T_4$ when the ramp signal RampOut is reset to voltage $V_{Start}$.

A similar process may take place for the second row read out. At time $T_0$ the ramp signal RampOut may be at a voltage level of $V_{Start}$. During read out for a second row in the pixel array 410, the reference block 470 may send reference voltages Vr and V1 to the calibration ADCs 434. A calibration ADC 434 may comprise circuitry (not shown) that may subtract the reference signals Vr and V1 and provide signal (Vr−V1) to an input of a comparator, which may be similar to, for example, the comparator element 300. The ramp signal RampOut may be an input to the comparator element 300. Accordingly, the comparator element 300 may compare the input signals (Vr−V1) with RampOut.

The voltage of the ramp signal RampOut may remain at $V_{Start}$ until time $T_1$ when the voltage level starts to ramp down. At time $T_3$ the voltage level of the ramp signal RampOut may be at $V_B$, which may be the voltage level of the input signal (Vr−V1). Accordingly, the comparator element 300 may assert an output signal Cmp_out that may be used to latch a count of clock cycles that may have elapsed from time $T_1$ to time $T_3$. This clock count may be referred to as digital code_1.

The digital code_0 may then be subtracted from the digital code_1, and the difference Code_diff may be compared with an expected ADC output, which may be an digital code equivalent to (V0−V1). If Code_diff is greater than the expected value, then $N_{i2}$ may be increased and $V_A$ and $V_B$ may be found again with the new gain for the ADCs in the ADC module 430. If Code_diff is smaller than the expected value, then $N_{i2}$ may be decreased and $V_A$ and $V_B$ may be found again with the new gain for the ADCs in the ADC module 430.

If Code_diff is the same as the expected value, then the calibration process is finished. Also, if the comparison result is opposite from the previous result, then the calibration process is also finished. That is, if the previous iteration showed Code_diff to be larger than the expected ADC output and the present iteration showed Code_diff to be smaller than the expected ADC output, or vice versa, then the calibration process is finished.

Figure 8:
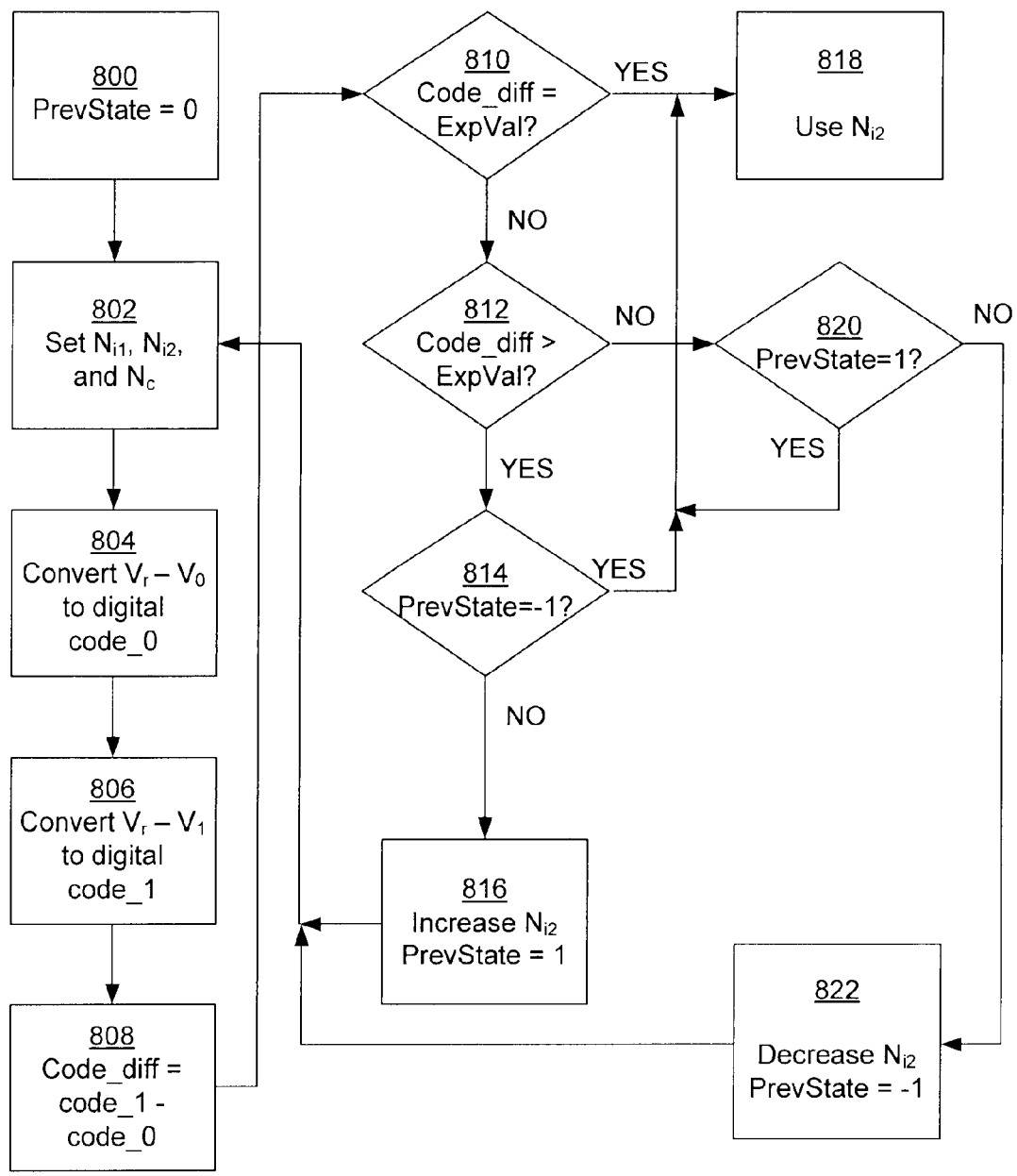
FIG. 8 is a flow diagram of an exemplary method for calibrating a ramp generator in accordance with an embodiment of the invention.

FIG. 8 is a flow diagram of an exemplary method for calibrating a ramp generator in accordance with an embodiment of the invention. Referring to FIG. 8, there are shown blocks 800 to 822 in the flow diagram.

Block 800 shows start of the calibration process where a variable PrevState may be set to 0 to indicate start of the calibration process. Block 802 shows that the control signals $N_{i1}$, $N_{i2}$, and $N_c$ may be set to default values for a desired gain. Block 804 shows that the digital code_0 may be generated and block 806 shows that the digital code_1 may be generated. Block 808 shows that a difference Code_diff may be generated by subtracting code_0 from code_1.

Block 810 shows that Code_diff may be compared to an expected ADC output ExpVal. If Code_diff is equal to ExpVal then block 818 shows that the present $N_{i2}$ may be used and the calibration process is finished. Otherwise, block 812 shows that Code_diff is compared to ExpVal. If Code_diff is greater than ExpVal, then block 814 shows that a check is made to see if PrevState is equal to −1. The PrevState is −1 when Code_diff is less than ExpVal.

If PrevState is equal to −1, which indicates that in the previous state Code_diff was less than ExpVal, then since in the present iteration Code_diff is greater than ExpVal, the flow of the flow diagram is to the next block 818 that shows that the present $N_{i2}$ may be used and the calibration process is finished.

Going back to block 812, if Code_diff is less than ExpVal then block 820 shows that a check is made to see if PrevState is equal to 1. The PrevState is 1 when Code_diff is greater than ExpVal.

If PrevState is equal to 1, which indicates that in the previous state Code_diff was greater than ExpVal, then since in the present iteration Code_diff is less than ExpVal, the flow of the flow diagram is to the next block 818 that shows that the present $N_{i2}$ may be used and the calibration process is finished. Otherwise, block 822 shows that the control signal $N_{i2}$ is decreased and PrevState is set to −1. The calibration process continues with the flow of the flow diagram going to block 802.

Going back to block 814, if PrevState is not equal to −1, block 816 shows that the control signal $N_{i2}$ is increased and PrevState is set to 1. The calibration process continues with the flow of the flow diagram going to block 802.

Accordingly, various embodiments of the invention for continuous ramp generator may consume less current than conventional current-steering DAC and switched-capacitor integrator approaches, and the operating speed may be higher than the other two approaches. Various embodiments of the invention may use the process described above to set the gain precisely and use a simple method to calibrate the signal swing as needed.

While the present invention has been described with reference to certain embodiments, it will be understood by those skilled in the art that various changes may be made and equivalents may be substituted without departing from the scope of the present invention. In addition, many modifications may be made to adapt a particular situation or material to the teachings of the present invention without departing from its scope. Therefore, it is intended that the present invention not be limited to the particular embodiment disclosed, but that the present invention will include all embodiments falling within the scope of the appended claims.

What is claimed is:

1. A method for processing signals, the method comprising:
    controlling a coarse gain of an analog-to-digital converter;
    controlling integer gain of the analog-to-digital converter; and
    controlling a fine gain of the analog-to-digital converter.

2. The method according to claim 1, wherein controlling of the coarse gain is via a first control signal to a first current generator, controlling of the integer gain is via a second control signal to a second current generator, and controlling of the fine gain is via a third control signal to an integrator.

3. The method according to claim 2, wherein the third control signal controls capacitance of a feedback capacitor for the integrator.

4. The method according to claim 1, comprising:
    communicating, by a first current generator controlled for the coarse gain, a first signal to an input of a second current generator, which is controlled for the integer gain;
    communicating, by the second current generator to an input of an integrator controlled for the fine gain, a second signal; and
    communicating by the integrator a ramp signal with a gain comprising the coarse gain, the integer gain, and the fine gain for use by the analog-to-digital converter.

5. The method according to claim 4, comprising calibrating the ramp signal.

6. The method according to claim 5, wherein calibrating the ramp signal comprises:
    using default values for a first control signal, a second control signal, and a third control signal to control a gain of the analog-to-digital converter;
    converting, with the analog-to-digital converter, a first analog reference signal to a first digital value;
    converting, with the analog-to-digital converter, a second analog reference signal to a second digital value;
    subtracting the first digital value from the second digital value to get a difference value; and
    tuning the second control signal based on comparing the difference value to an expected value.

7. A method for calibrating an analog-to-digital converter, the method comprising:
    using default values for a first control signal, a second control signal, and a third control signal to control a gain of the analog-to-digital converter;
    converting, with the analog-to-digital converter, a first analog reference signal to a first digital value;
    converting, with the analog-to-digital converter, a second analog reference signal to a second digital value;
    subtracting the first digital value from the second digital value to get a difference value; and
    tuning the second control signal based on comparing the difference value to an expected value.

8. The method according to claim 7, wherein the first control signal controls coarse gain of the analog-to-digital converter, the second control signal controls integer gain of the analog-to-digital converter, and the third control signal controls fine gain of the analog-to-digital converter.

9. The method according to claim 7, comprising increasing a value of the second control signal if the difference value is larger than the expected value and decreasing the value of the second control signal if the difference value is smaller than the expected value.

10. The method according to claim 7, comprising ending the calibration of the analog-to-digital converter if the difference value is equal to the expected value.

11. The method according to claim 7, comprising ending the calibration of the analog-to-digital converter if the difference value is larger than the expected value in a present iteration and the difference value was less than the expected value in an immediately previous iteration.

12. The method according to claim 7, comprising ending the calibration of the analog-to-digital converter if the difference value is less than the expected value in a present iteration and the difference value was larger than the expected value in an immediately previous iteration.

13. A system for processing signals in an analog-to-digital converter, the system comprising:
    a first current generator controlled by a first control signal;
    a second current generator controlled by a second control signal; and
    an integrator controlled by a third control signal,
    wherein the first control signal controls coarse gain, the second control signal controls integer gain, and the third control signal controls fine gain.

14. The system according to claim 13, wherein the first current generator is a digital-to-analog converter which communicates a first signal to an input of the second current generator,
    wherein the second current generator is a digital-to-analog converter which communicates a second signal to an input of the integrator, and
    the integrator outputs a ramp signal with a gain comprising the coarse gain, the integer gain, and the fine gain for use by the analog-to-digital converter.

15. The system according to claim 13, wherein the total gain of the analog-to-digital converter depends on values for the first control signal, the second control signal, and the third control signal, and wherein
    a first analog reference signal is converted to a first digital value by the analog-to-digital converter,
    a second analog reference signal is converted to a second digital value by the analog-to-digital converter,
    the first digital value is subtracted from the second digital value to get a difference value, and
    the second control signal is tuned based on comparing the difference value to an expected value.

16. A system for image processing, the system comprising:
- an analog-to-digital converter (ADC) array comprising columns ADCs and at least one calibration ADC;
- a ramp generator module configured to provide a ramp signal to the column ADCs and the calibration ADCs;
- a reference module configured to provide reference signals to the calibration ADCs and to the ramp generator module; and
- control circuitry configured to provide control signals to the ramp generator module.

17. The system according to claim 16, wherein the column ADCs are configured to convert analog pixel signals to digital data.

18. The system according to claim 16, wherein the ramp generator module comprises a first current generator, a second current generator, and an integrator.

19. The system according to claim 18, wherein the ramp signal is calibrated using a first control signal to control the first current generator, a second control signal to control the second current generator, and a third control signal to control the integrator, and wherein the first control signal, the second control signal, and the third control signal are generated by the control circuitry.

20. The system according to claim 19, wherein default values are used for the first control signal, the second control signal, and the third control signal to generate a ramp signal for use by the column ADCs.

21. The system according to claim 19, wherein the calibration ADC converts a first analog reference signal to a first digital value and the calibration ADC converts a second analog reference signal to a second digital value.

22. The system according to claim 21, wherein the control circuitry comprises a subtraction module configured to subtract the first digital value from the second digital value to get a difference value, and the control circuitry tunes the second control signal based on comparing the difference value to an expected value.

23. The system according to claim 22, wherein the control circuitry increases a value of the second control signal if the difference value is larger than the expected value and decreases the value of the second control signal if the difference value is smaller than the expected value.

24. The system according to claim 22, wherein the control circuitry ends the calibration of the ramp signal if the difference value is equal to the expected value.

25. The system according to claim 22, wherein the control circuitry ends the calibration of the ramp signal if the difference value is larger than the expected value in a present iteration and the difference value was less than the expected value in an immediately previous iteration.

26. The system according to claim 22, wherein the control circuitry ends the calibration of the ramp signal if the difference value is less than the expected value in a present iteration and the difference value was larger than the expected value in an immediately previous iteration.

\* \* \* \* \*